STANDARD SUBMINIATURE PACKAGE TECHNIQUE

Filed Jan. 26, 1955 3 Sheets-Sheet 1

INVENTORS
CARL L. ANDERSON
HOWELL L. CARTER, JR.
BY Elmer J. Gorn
ATTORNEY

Jan. 5, 1960 C. L. ANDERSON ET AL 2,920,245

STANDARD SUBMINIATURE PACKAGE TECHNIQUE

Filed Jan. 26, 1955 3 Sheets-Sheet 2

INVENTORS
CARL L. ANDERSON
HOWELL L. CARTER, JR.
BY Elmer J. Gorn
ATTORNEY

INVENTORS
CARL L. ANDERSON
HOWELL L. CARTER, JR.
BY Elmer J. Gorn
ATTORNEY

United States Patent Office 2,920,245

Patented Jan. 5, 1960

2,920,245

STANDARD SUBMINIATURE PACKAGE TECHNIQUE

Carl L. Anderson, Waltham, and Howell L. Carter, Jr., Natick, Mass., assignors to Raytheon Company, a corporation of Delaware Application January 26, 1955, Serial No. 484,287

5 Claims. (Cl. 317—101)

This invention relates generally to packaging techniques for subminiature electronic devices, and more particularly to the physical arrangement of a plurality of subminiature electronic tubes and circuit components on a chassis, and to support means and housing means for the assembled components.

Miniaturization of electronic circuits due to advances in electronic technology providing complex and extensive circuitry for multicapacity functions has become increasingly important, especially where the size and weight of the unit is limited by environmental operational factors such as in aircraft installations. With the continued improvement in circuitry to achieve greater accuracy, and more complete and new functions, the need for more extensive reductions in weight and volume to keep pace with the ever increasing development of an improved system has developed. Concomitantly with attempted reductions in size, various thermal, electrical, and structural problems have been encountered which seriously hamper the efficient and proper operation of the subminiature devices. Since all such devices are required to occupy but a fraction of the weight and volume of the larger units while handling the same amount of power with equivalent or improved performance, it is apparent that the requirements of power transmission alone necessitate the dissipation of the same amount of heat within smaller volume dimensions, and accordingly result in undesirably high operating temperatures unless improved cooling methods are provided. In addition, the high frequency effects prevalent in all electronic circuits operating at relatively high frequencies assume exaggerated importance in subminiature circuits. The dimensions of the components themselves, the connecting wires, and the relative placement of the parts, whose effect may be negligible at the low frequencies, become increasingly important as the frequency is raised due to the undesired interaction of stray capacitance and inductance with the various parts.

In order to reduce these thermal, electrical, and structural difficulties encountered in electronic circuit miniaturization, the present inventive concept provides a novel, light-weight, hermetically sealed package construction including a shielding member adapted to hold a plurality of subminiature electron tubes and prepackaged circuit components in a compact array determined by little more than the physical size of the tubes and components themselves. The corrugated shielding member allows the production of a unit having better electrical isolation and thermal dissipation qualities than heretofore attainable, while providing a versatile, repetitive pattern which is easily adaptable to fit varying circuit requirements.

The invention will be better understood as the following description proceeds taken in conjunction with the accompanying drawings wherein.

Figure 1:
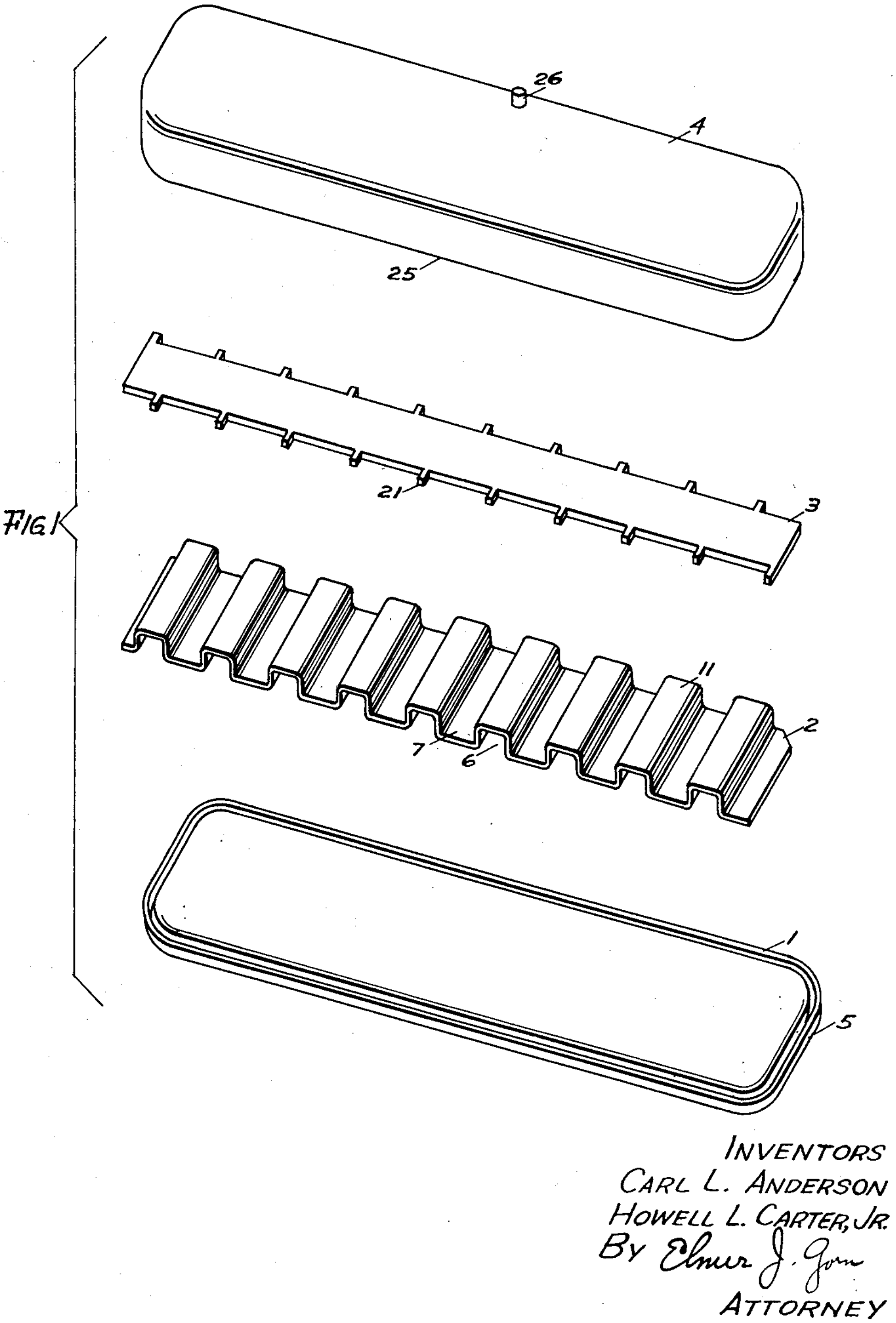
Fig. 1 is an exploded isometric view of the various structural components of the package in accordance with the invention.

Referring now to the drawings, and more particularly to Fig. 1, there is shown an exploded view of the preferred structure of the basic parts of an IF amplifier package assembly comprising a base panel 1, a corrugated strip member 2, a ground plate 3, and a cover 4. Base panel 1 comprises a rigid, rectangularly shaped planar member of sheet material having high electrical and thermal conductive properties, and may be a shallow stamping of cold rolled steel, for example, provided with a solder seal groove 5 around its perimeter. As shown best in Fig. 2, strip 2, which may be of the same material as base panel 1, is provided with corrugated portions 11, and is designed to be attached to base panel 1 as by spot-welding, and to coact therewith to form retaining pockets 6 to position subsequently added subminiature tubes for conductive cooling and electrical shielding. Ground plate 3 is intended to be attached in a similar manner across the tops of corrugations 11, and in conjunction therewith forms a second set of retaining pockets 7 for holding additional electrical components in proper relation to the tubes.

After initial attachment of strip 2 and ground plate 3, a subminiature electronic tube 8 may be inserted into each of the plurality of pockets 6, formed by the base panel 1 and the corrugated portions of strip 2. In order to secure the tubes against vibration and shock, and more importantly to effect efficient conductive cooling of the tubes, they are first enclosed in a spring slip 9 which which may be made of a resilient, efficient heat-conducting material, such as Phosphor bronze, for example. A clip 9 and its associated tube is then inserted into each of pockets 6. The undulating portions 10 of clip 9 bear firmly against the underside of corrugations 11, and force the tube 8 into intimate contact with the bottom portion 12 of the clip. Bottom portion 12 is also in intimate contact with base panel 1, which in turn may be placed in intimate contact with a cooling plate (not shown) located on the particular apparatus with which the amplifier package is being utilized. This novel cooling arrangement provides an extremely short thermal path to any desired heat sink, and results in a package unit in which the temperature rise is held to a negligible figure.

Figures 2, 3, 4, 5:
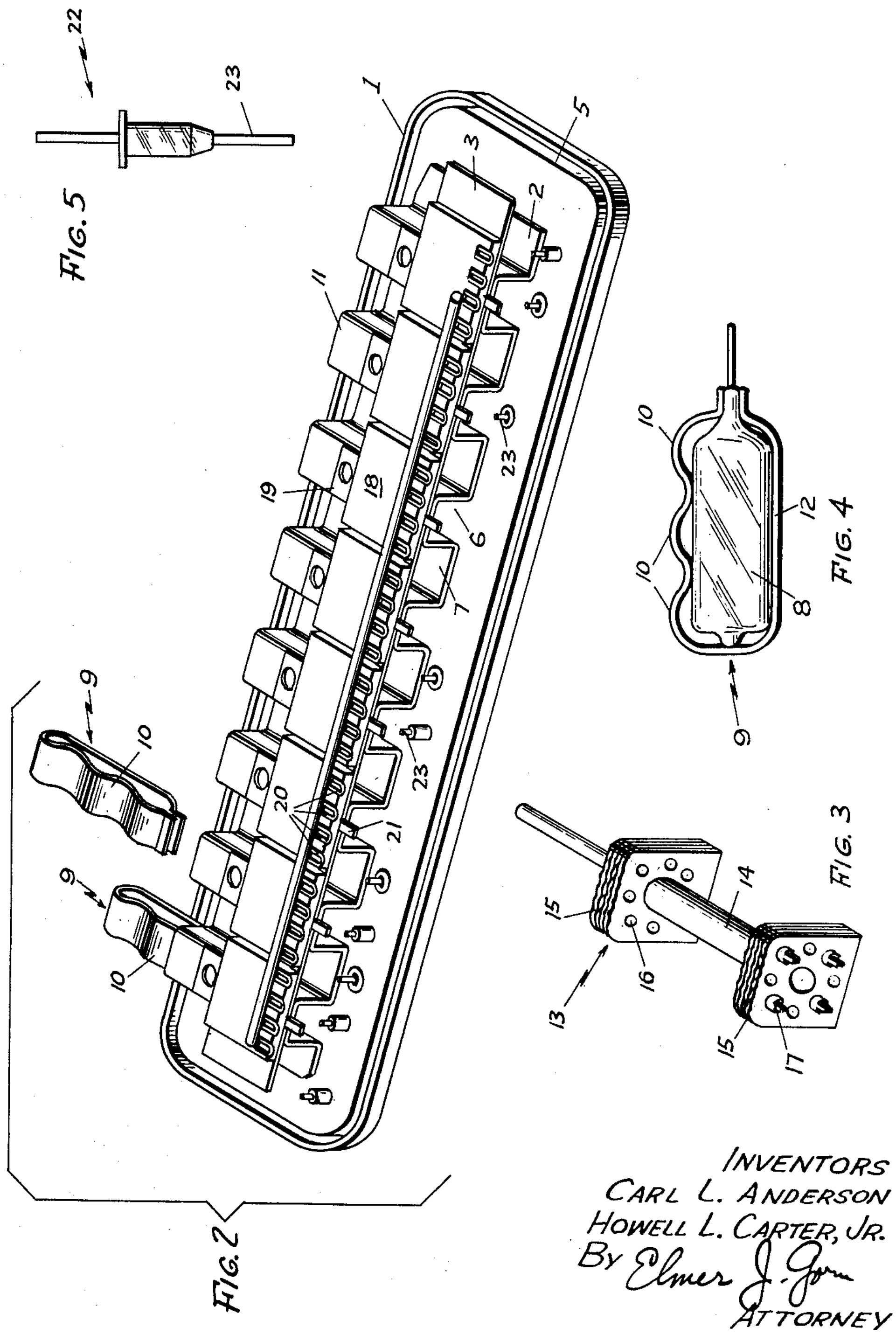
Fig. 2 is an isometric view of a partially assembled unit without the addition of tubes and circuit components.
Fig. 3 is an isometric view of a mounting form adapted to hold prepackaged circuit components.
Fig. 4 is a side view of a tube-holding clip.
Fig. 5 is a side view of one of a plurality of feed-throughs adapted to fit into the base of the package for unit interconnection.

In Fig. 3 there is shown an enlarged isometric view of a holding form 13 for mounting subminiature resistors, crystals, and capacitors, and suitable for use in accordance with the package structure of the present invention. Form 13 comprises a tubular rod 14 having two longitudinally spaced vertical plates attached along its axis. The form may be composed of a solid, non-conducting material such as nylon or paper-based phenolic. Plates 15 are provided with a plurality of holes 16 for receiving the desired electrical components, circuit interconnections being accomplished by means of terminal lugs 17. After the various components have been assembled on a plurality of forms 13, each assembly may be slipped into one of each of the second set of retaining pockets 7, formed by the corrugations in strip 2 and ground plate 3. Mounted on top of ground plate 3 in compact array are a plurality of multisection, high-K, ceramic, by-pass capacitors 18, each having a common ground tab 19, In the embodiment shown, capacitors 18 each have four internally located, physically and electrically isolated sections, each connected to a separate terminal lug 20. This manner of mounting the components within the package assembly allows short point-to-point wiring between tubes and components, the ground plate 3 being provided with small projections 21 for making the soldered ground connections of the circuitry. The tubes 8, and the components mounted on form 13, are effectively shielded by their respective enclosing pockets thus eliminating electrical interaction effects between the parts.

Figures 6, 7:
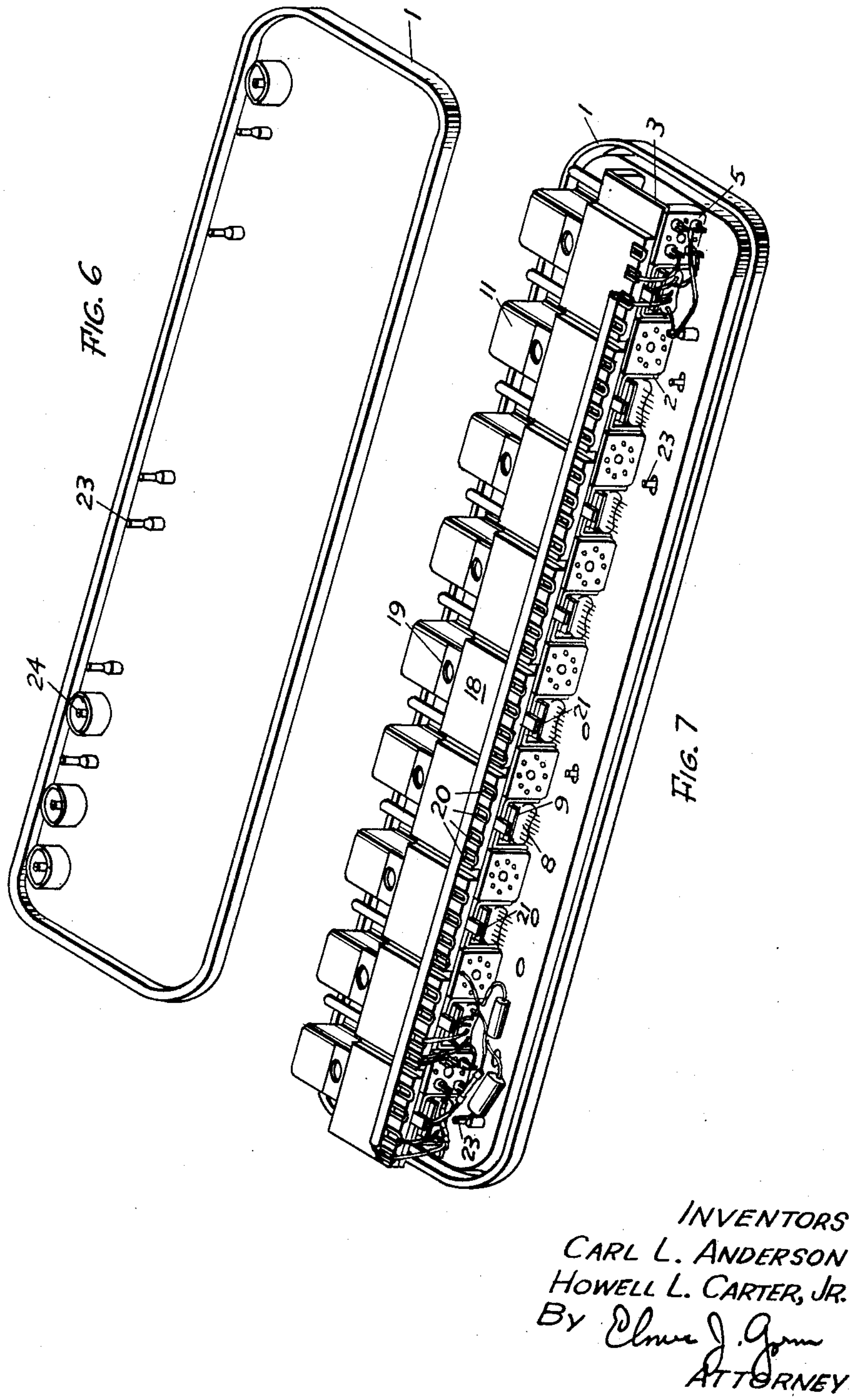
Fig. 6 is an isometric view of the bottom of the base of the package.
Fig. 7 is an isometric view of an assembled package with partially connected circuit components prior to hermetically sealing the cover in place.

To provide for quickly connecting and disconnecting the package to and from any desired circuit application, it may be constructed with plug-in connection features. As shown in Figs. 2, 7, and 8, base panel 1 may be provided with appropriately located holes into which glass bead feed-throughs 22 are sealed in any convenient manner, as by spot-welding. The necessary electrical wiring connections between the various components and feed-throughs 22 are then made, and the stems 23 projecting through the bottom of base panel 1 act as a male plug for unit interconnection, where desired coaxial fittings 24 can be included.

Hermetic sealing, or more specifically, sealing the assembled circuitry within the package, and thereafter filling the package with an inert atmosphere, is desirable for retarding the rapid deterioration of electrical components resulting from their high operating temperatures when compactly assembled in the configuration of Fig. 7. To accomplish hermetic sealing, cover 4 is placed over the assembly of Fig. 7 with the bottom edge 25 mating into groove 5 of the base panel, and the unit is sealed as by soldering. An open-ended tube 26 may be fastened within a vent hole in the top of cover 4, and by successive operations the air evacuated from the package through this tube, and an inert gas forced into the package. Thereafter tube 26, preferably made of a soft metal, such as copper, may be clipped and the opening sealed thereby preventing the escape of the inert gas, and completing the hermetic enclosure.

Although there has been shown what is considered to be a preferred embodiment of the present invention, various adaptations and modifications thereof may be made without departing from the spirit and scope of the invention as defined in the appended claims.

What is claimed is:

1. A package assembly for compactly housing subminiature electronic components comprising a conductive base panel, a single corrugated strip attached to said base panel, said strip and said base panel defining a plurality of pockets containing subminiature electronic tubes, a ground plate mounted on said corrugated strip, said strip and said ground plate defining a plurality of additional pockets containing multicomponent holding means, and a cover hermetically sealed to said base panel.

2. A package assembly for compactly housing subminiature electronic components comprising a conductive base panel, a single corrugated strip attached to said base panel, said strip and said base panel defining a plurality of first pockets containing subminiature electronic tubes, a ground plate mounted on said corrugated strip, said plate and said strip defining a plurality of second pockets containing multicomponent holding means, a plurality of clips adapted to firmly grip said tubes and retain them in close relation to said base panel, and a cover hermetically sealed to said base panel.

3. A package assembly for compactly housing subminiature electronic components comprising a conductive base panel, said base panel being provided with electrically conductive feed-throughs whereby said package may be readily connected to and disconnected from an associated circuit, a single corrugated strip attached to said base panel, said strip and said base panel defining a plurality of first pockets containing subminiature electronic tubes, a ground plate mounted on said corrugated strip, said plate and said strip defining a plurality of second pockets containing multicomponent holding means, a plurality of clips adapted to interengage one of each of said pockets and firmly hold said tubes in close relation to said base panel, and a cover hermetically sealed to said base panel.

4. A package assembly for compactly housing electronic components comprising a conductive base panel having opposite planar faces, a single shielding means having extended portions in direct substantial surface area attachment with a first of said faces and having other portions raised above the level of said first face out of contact with said first face whereby housing areas adapted to hold electronic components are provided, a planar ground plate mounted in substantial surface area contact with said other portions, said other planar face of said base panel being exposed over substantially its entire surface, and a cover hermetically sealed to said first face of said base panel.

5. A package assembly for compactly housing electronic components comprising a conductive base panel, a single corrugated strip having some of its corrugations in direct substantial surface area attachment to one face of said base panel and other of its corrugations out of contact with said one face, a planar ground plate mounted in substantial surface area contact with said other corrugations, said other planar face of said base panel being exposed over substantially its entire face, and a cover adapted to be hermetically sealed to said one face of said base panel.

References Cited in the file of this patent

UNITED STATES PATENTS

| | | |
|---|---|---|
| 1,682,778 | Edelman | Sept. 4, 1928 |
| 1,982,501 | Douglas | Nov. 27, 1934 |
| 2,042,806 | Schulte | June 2, 1936 |
| 2,198,465 | Stokes | Apr. 23, 1940 |
| 2,352,576 | Triplett | June 27, 1944 |
| 2,474,988 | Sargrove | July 5, 1949 |
| 2,579,141 | Eckert | Dec. 18, 1951 |
| 2,641,635 | Scal et al. | June 9, 1953 |
| 2,668,933 | Shapiro | Feb. 9, 1954 |

FOREIGN PATENTS

| | | |
|---|---|---|
| 693,016 | Great Britain | June 17, 1953 |